US012696411B2

(12) United States Patent
Kumarapuram Anantharaman et al.

(10) Patent No.: US 12,696,411 B2
(45) Date of Patent: Jul. 28, 2026

(54) STANDOFF FOR CIRCUIT CARD ASSEMBLIES

(71) Applicant: Hamilton Sundstrand Corporation, Charlotte, NC (US)

(72) Inventors: Sanjay Kumarapuram Anantharaman, Bangalore (IN); Debasis Rout, Bengaluru (IN)

(73) Assignee: Hamilton Sundstrand Corporation, Charlotte, NC (US)

( * ) Notice: Subject to any disclaimer, the term of this patent is extended or adjusted under 35 U.S.C. 154(b) by 235 days.

(21) Appl. No.: 18/539,752

(22) Filed: Dec. 14, 2023

(65) Prior Publication Data

US 2025/0120033 A1　　Apr. 10, 2025

(30) Foreign Application Priority Data

Oct. 4, 2023　　(IN) .............................. 202311066621

(51) Int. Cl.
　　*H05K 7/14*　　　　(2006.01)
　　*H05K 1/14*　　　　(2006.01)
(52) U.S. Cl.
　　CPC ............. *H05K 7/142* (2013.01); *H05K 1/144* (2013.01); *H05K 2201/042* (2013.01); *H05K 2201/2036* (2013.01)
(58) Field of Classification Search
　　CPC .. H05K 1/14; H05K 1/141–147; H05K 7/142; H05K 2201/042; H05K 2201/10409; H05K 2201/2036
　　USPC ........ 361/756–759, 770, 790, 803, 807–810; 411/337, 378, 402, 411
　　See application file for complete search history.

(56) References Cited

U.S. PATENT DOCUMENTS

| | | | | |
|---|---|---|---|---|
| 4,760,495 A | * | 7/1988 | Till | F16B 5/0233 |
| | | | | 411/509 |
| 4,875,140 A | | 10/1989 | Delpech et al. | |
| 5,713,690 A | * | 2/1998 | Corbin, Jr. | H01L 23/4006 |
| | | | | 174/16.3 |
| 6,280,202 B1 | | 8/2001 | Alden et al. | |
| 6,439,817 B1 | * | 8/2002 | Reed | F16B 39/06 |
| | | | | 411/110 |
| 6,493,233 B1 | | 12/2002 | De et al. | |

(Continued)

OTHER PUBLICATIONS

Extended European Search Report for EP Application No. 24204056. 6, dated Feb. 25, 2025, pp. 1-10.

*Primary Examiner* — Tuan T Dinh
(74) *Attorney, Agent, or Firm* — Kilpatrick Townsend & Stockton LLP

(57) ABSTRACT

Circuit card assemblies include an enclosure, first and second circuit boards, and a standoff for mounting the first and second circuit boards within the enclosure. The standoff includes a support body extending between the first and second circuit boards and has a first end and a second end. The first end is proximate the first circuit board and the second end is proximate the second circuit board. A threaded portion extends from the first end and passes through an aperture of the first circuit board. An internal bore is defined within the support body and includes an opening at the second end of the support body. A sleeve extends from the second end of the support body and has an opening aligned with the opening of the internal bore. The sleeve extends into an aperture of the second circuit board with a support shelf defined around the sleeve.

17 Claims, 9 Drawing Sheets

(56)  References Cited

U.S. PATENT DOCUMENTS

| | | | |
|---|---|---|---|
| 6,609,914 B2 * | 8/2003 | Dibene | H01R 12/7088 |
| | | | 439/74 |
| 7,086,896 B2 * | 8/2006 | Edwards | H05K 7/142 |
| | | | 439/573 |
| 7,614,602 B2 * | 11/2009 | Hutter, III | H02G 3/30 |
| | | | 411/533 |
| 8,757,575 B2 | 6/2014 | Lin et al. | |
| 9,042,105 B2 | 5/2015 | Malek et al. | |
| 9,374,900 B2 | 6/2016 | Huffman et al. | |
| 10,218,098 B1 * | 2/2019 | Lian | H01R 12/7082 |
| 10,720,719 B2 | 7/2020 | Downing et al. | |
| 2013/0148322 A1 * | 6/2013 | Fosnes | H05K 1/144 |
| | | | 29/842 |
| 2020/0154569 A1 | 5/2020 | Wu et al. | |

* cited by examiner

STANDOFF FOR CIRCUIT CARD ASSEMBLIES

CROSS-REFERENCE TO RELATED APPLICATIONS

This application claims the benefit of India application Ser. No. 202311066621, filed Oct. 4, 2023, the disclosure of which is incorporated herein by reference in its entirety.

BACKGROUND

The subject matter disclosed herein generally relates to circuit card assemblies and circuit board assemblies and, more particularly, to standoff components for circuit card assemblies and circuit board assemblies.

Controllers and other electronic devices may be formed from a stack of circuit cards and/or circuit boards, referred to herein as "CCA" (for "circuit card assembly") and a stacked CCA refers to a group of circuit cards or boards that are assembled together in a vertical stack. The stacked CCA may be housed within a housing or enclosure that is arranged, for example and without limitation, to maximize electronic connectivity between the components, provide cooling schemes thereto, and minimize size and volume of the CCA stack. Such CCA stacks may be used in the aircraft industry for controllers or the like, and when assembled within a housing or enclosure, may be referred to as a control box or the like.

When assembling a set of circuit cards/boards (generally referred to as circuit boards) as a CCA, the boards may be separated by some distance using a structural separator. The structural separators may be referred to as standoffs and may be configured to both secure the boards within the encloser and secure the boards together with a separation gap. As such, the standoffs may include a fastener that provides securing attachment between the different boards and/or with the housing/enclosure. In some configurations of CCAs and associated enclosures, the standoffs may be integrated into the enclosure and support the stacked CCA.

Generally, the standoffs may be made of aluminum material to dissipate heat from the CCA via one or more copper layers. However, use of standoffs, while providing certain benefits, may result in damage to components or reduced part life due to the nature of the assembly and disassembly thereof. For example, by applying uneven torque to the fastener of the standoff, the standoffs may loosen during disassembly. This loosening of the standoffs can lead to failure of removal of the CCA. Further, such configuration can result in friction generation due to the rotation of the fastener when installing/uninstalling. This friction can cause a copper layer to be peeled off from boards of the CCA or result in an electrical short circuit. Further, uneven support from a standoff can result in a bend in the boards of the CCA which can cause stresses and may ultimately result in damage to the boards and/or CCA. Accordingly, improved mounting and support mechanisms for retaining boards of a CCA to each other and/or to an enclosure may be beneficial to increase part life and operational use while improving ease of installation and disassembly.

SUMMARY

According to some embodiments, circuit card assemblies are provided. The circuit card assemblies include an enclosure, a first circuit board installed within the enclosure, a second circuit board installed within the enclosure, and a standoff arranged to mount the first circuit board and the second circuit board within the enclosure. The standoff includes a support body extending between the first circuit board and the second circuit board, the support body having a first end and a second end, wherein the first end is proximate the first circuit board and the second end is proximate the second circuit board, a threaded portion extending from the first end and passing through an aperture of the first circuit board, an internal bore defined within the support body and having an opening at the second end of the support body, a sleeve extending from the second end of the support body, the sleeve having an opening aligned with the opening of the internal bore, wherein the sleeve extends into an aperture of the second circuit board, and a support shelf defined at the second end of the support body, the support shelf defined at an external surface of the sleeve.

In addition to one or more of the features described herein, or as an alternative, further embodiments of the circuit card assemblies may include a first washer arranged between the first end of the support body and a surface of the first circuit board and a second washer arranged between the support shelf and a surface of the second circuit board.

In addition to one or more of the features described herein, or as an alternative, further embodiments of the circuit card assemblies may include a third washer arranged on a surface of the second circuit board opposite the second washer and a fastener installed to pass through the third washer, the aperture of the second circuit board, the second washer, and engage with the support body within the internal bore.

In addition to one or more of the features described herein, or as an alternative, further embodiments of the circuit card assemblies may include that the internal bore is threaded.

In addition to one or more of the features described herein, or as an alternative, further embodiments of the circuit card assemblies may include that the enclosure comprises a base and a cover.

In addition to one or more of the features described herein, or as an alternative, further embodiments of the circuit card assemblies may include that the enclosure comprises a post, wherein the threaded portion of the standoff is configured to threadedly engage with the post.

In addition to one or more of the features described herein, or as an alternative, further embodiments of the circuit card assemblies may include that the sleeve extends a distance from the support shelf that is less than a thickness of the second circuit board.

In addition to one or more of the features described herein, or as an alternative, further embodiments of the circuit card assemblies may include that the first circuit board comprises a first mounting feature and the second circuit board comprises a second mounting feature.

In addition to one or more of the features described herein, or as an alternative, further embodiments of the circuit card assemblies may include that each of the first mounting feature and the second mounting feature define respective apertures.

In addition to one or more of the features described herein, or as an alternative, further embodiments of the circuit card assemblies may include that each of the first mounting feature and the second mounting feature are defined by a conductive material.

In addition to one or more of the features described herein, or as an alternative, further embodiments of the circuit card assemblies may include that the first circuit board is supported on a post of the enclosure, a first washer is arranged on the first circuit board, the threaded portion of the standoff is installed through the first washer and into engagement with the post, a second washer is arranged about the sleeve of the standoff, the second circuit board is installed on top of the second washer, a third washer is arranged on the second circuit board on a side opposite the second washer, and a fastener is installed through the third washer, the second circuit board, the second washer, and into engagement with the support body of the standoff.

In addition to one or more of the features described herein, or as an alternative, further embodiments of the circuit card assemblies may include that the first circuit board comprises a mounting feature having an aperture, wherein the first washer is arranged in contact with the mounting feature and aligned with the aperture of the first circuit board.

In addition to one or more of the features described herein, or as an alternative, further embodiments of the circuit card assemblies may include that the second circuit board comprises a mounting feature having an aperture, wherein the second washer is arranged in contact with the mounting feature on a first side of the second circuit board and the third washer is arranged in contact with the mounting feature on a second side of the second circuit board, wherein the second washer and the third washer are aligned with the aperture of the second circuit board.

In addition to one or more of the features described herein, or as an alternative, further embodiments of the circuit card assemblies may include that the sleeve has a distance of extension from the support shelf that is at least 10% a thickness of the second circuit board.

According to some embodiments, standoff assemblies for use with circuit card assemblies (CCA) are provided. The standoff assemblies includes a support body having a first end and a second end, a threaded portion extending from the first end, an internal bore defined within the support body and having an opening at the second end of the support body, a sleeve extending from the second end of the support body, the sleeve having an opening aligned with the opening of the internal bore, and a support shelf defined at the first end of the support body, the support shelf defined at an external surface of the sleeve.

In addition to one or more of the features described herein, or as an alternative, further embodiments of the standoff assemblies may include that the internal bore is threaded.

In addition to one or more of the features described herein, or as an alternative, further embodiments of the standoff assemblies may include a first washer arranged to fit over the threaded portion and contact the first end of the support body and a second washer arranged to fit over the sleeve and contact the second end of the support body.

In addition to one or more of the features described herein, or as an alternative, further embodiments of the standoff assemblies may include a third washer configured to be positioned above the second washer and the sleeve when installed within a CCA.

In addition to one or more of the features described herein, or as an alternative, further embodiments of the standoff assemblies may include that the sleeve has a length that is at least 2.5× a thickness of the second washer.

In addition to one or more of the features described herein, or as an alternative, further embodiments of the standoff assemblies may include that the support body is formed from a conductive material.

The foregoing features and elements may be combined in various combinations without exclusivity, unless expressly indicated otherwise. Features which are described in the context of separate aspects and embodiments may be used together and/or be interchangeable. Similarly, features described in the context of a single embodiment may also be provided separately or in any suitable subcombination. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The subject matter is particularly pointed out and distinctly claimed at the conclusion of the specification. The foregoing and other features, and advantages of the present disclosure are apparent from the following detailed description taken in conjunction with the accompanying drawings in which:

DETAILED DESCRIPTION

Figure 1A:
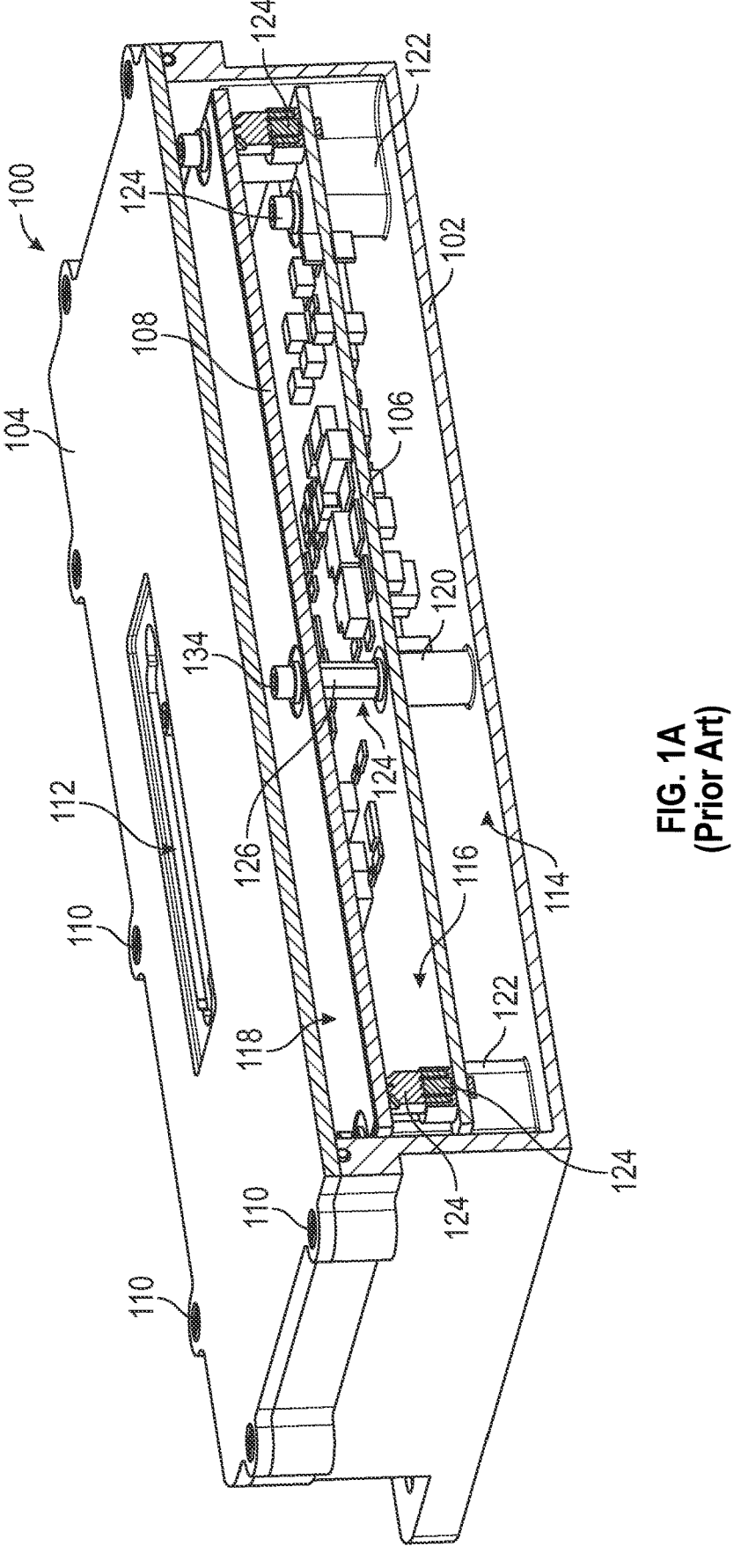
FIG. 1A is a schematic illustration of a conventional circuit card assembly (CCA)
Figures 1B, 1C:
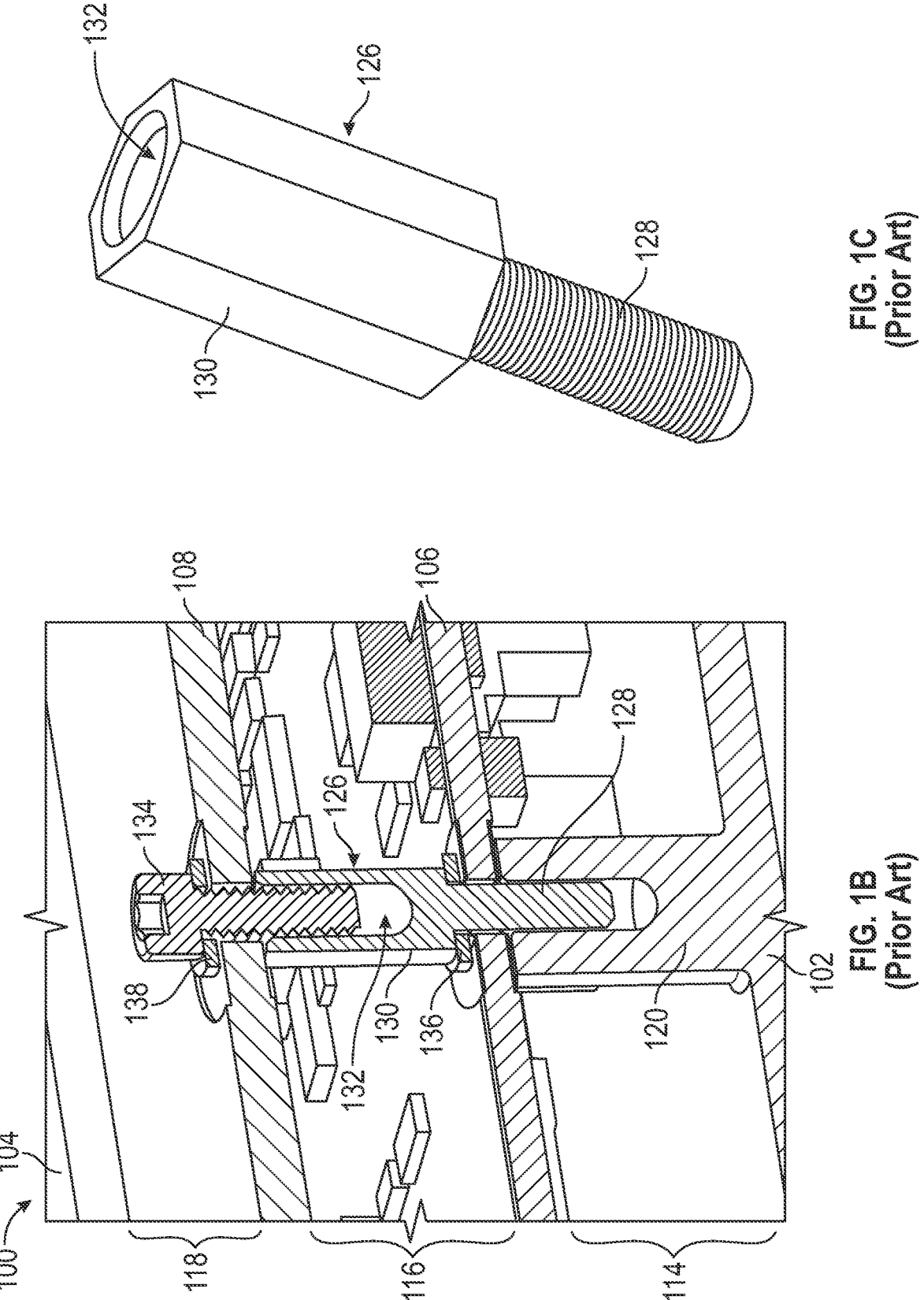
FIG. 1B is an enlarged, cross-sectional schematic illustration of a portion of the CCA of FIG. 1A.
FIG. 1C is a schematic illustration of a standoff used with the CCA of FIG. 1A.

Referring to FIGS. 1A-1C, schematic illustrations of an electronic unit 100 and components thereof are shown. The electronic unit 100 may be configured as an electronic control box, electronic controller, or other electronic control device for use onboard an aircraft to operate as an electronic controller or the like. The electronic unit 100 includes an enclosure 102, 104, with multiple circuit boards 106, 108 installed therein. The circuit boards 106, 108 may be arranged as a circuit card assembly (CCA) where each of the circuit boards 106, 108 is part of a greater assembly for processing, controlling, or otherwise performing electronic and/or electrical functions. As such, the circuit boards 106, 108 may be electrically and/or electronically connected or coordinated for performing various tasks as will be appreciated by those of skill in the art.

As shown, the enclosure 102, 104 includes a base 102 and a cover 104 that may be attached or connected together using one or more enclosure fasteners 110. The cover 104 may include an opening 112 to allow for cables or the like to connect to one or more of the circuit boards 106, 108 and/or the allow a user to access components in, on, or of the circuit boards 106, 108. As noted, the circuit boards 106, 108 may be arranged as a CCA. Although shown with only two circuit boards 106, 108, it will be appreciated that electronic units can be configured with more than two circuit boards without departing from the scope of the present disclosure while incorporating embodiments as described herein.

As described herein, the example electronic unit 100 will be described with respect to the base 102 and the cover 104 of the enclosure and the first circuit board 106 and the second circuit board 108. As assembled, the first circuit board 106 is arranged between the base 102 and the second circuit board 108 and the cover 104 is above the second circuit board 108, thus forming a stack or stacked arrangement. A first gap 114 is defined between the base 102 and the first circuit board 106, a second gap 116 is defined between the first circuit board 106 and the second circuit board 108, and a third gap 118 is defined between the second circuit board 108 and the cover 104.

The circuit boards 106, 108 may be mounted and secured within the enclosure 102, 104 through fasteners, posts, standoffs, and the like. For example, as shown in FIGS. 1A-1B, the first circuit board 106 may be supported, in part, by a post 120 that is arranged between the first circuit board 106 and the base 102. The post 120 may be integrally formed with or part of the base 102, or may be threadedly attached or welded to the base 102, or may be otherwise fixedly attached to the base 102. The first circuit board 106 will rest on the post 120 but may not attach thereto. The base 102 may include additional posts 122 located at various positions one the base 102. The posts 120, 122 are configured to provide support to the first circuit board 106 and ensure the first gap 114 is maintained between the first circuit board 106 and the base 102. Some or all of the posts 120, 122 may have internal threaded bores for receiving fasteners 124. The fasteners 124 may be installed by passing through the first circuit board 106 and then threadedly engaging with the posts 120, 122. As such, the fasteners 124 may be used to secure the first circuit board 106 to the base 102. In this configuration, one fastener 124 arranged in the central area of the electronic unit 100 may be arranged as a standoff 126. The standoff 126 includes a threaded portion 128 (FIGS. 1B-1C) that threadedly engages with the post 120.

The standoff 126 includes a support body 130 that the threaded portion 128 extends from. The support body 130 is arranged to extend between the first circuit board 106 and the second circuit board 108 when installed in the electronic unit 100, as shown in FIGS. 1A-1B. The support body 130 is arranged to provide a structure support between the first and second circuit boards 106, 108, and thus maintain the second gap 116 therebetween. The standoff 126 includes a threaded internal bore 132 within the support body 130 for receiving a fastener 134. The fastener 134 may pass through the second circuit board 108 and threadedly engage with the threaded internal bore 132 of the standoff 126. As shown, a first washer 136 is provided between the support body 130 and the first circuit board 106 and a second washer 138 is provided between the fastener 134 and the second circuit board 108. The material of the standoff 126 and the washers 136, 138 may be selected to be electrically conductive. It will be appreciated that other standoff structures may be provided in other locations and the single configuration shown in FIGS. 1A-1C is merely for illustrative purposes and is not intended to be limiting.

The standoff 126, in this example configuration, is arranged in the middle of the enclosure 102, 104 and support the second circuit board 108 within the electronic unit 100. The standoff 126 may be integrated into the base 102 of the enclosure. The standoff 126 may be made from aluminum material to dissipate heat from the circuit boards 106, 108 via copper layers. During assembly and/or disassembly of the electronic unit 100, the fasteners 124, 134 and the standoff 126 (with threaded portion 128) will be rotated relative to the circuit boards 106, 108. By applying uneven torque to the fastener(s), and particularly to the standoff 126, the standoff 126 may loosen during disassembly. This loosening of the standoff 126 can lead to failure in removing the circuit boards 106, 108. Further, due to the loosening and/or uneven application of torque, friction may be generated. This friction can cause a copper layer can be peeled off from circuit boards 106, 108 and/or cause electrical short circuits in the circuit boards 106, 108. Furthermore, uneven application of torque can cause bending of the circuit boards 106, 108 which causes stress to the material of the circuit boards 106, 108, and thus the circuit boards 106, 108 may become damaged.

Specifically, with respect to the standoff 126, when the fastener 134 is rotated, such as to remove the second circuit board 108, the rotation of the fastener 134 may cause rotation of the standoff 126. That is, due to the threaded engagement between the fastener 134 and the threaded internal bore 132, the rotation of the fastener 134 may cause rotation of the standoff 126. This rotation of the standoff 126 can cause scratching of material (e.g., copper or other conductive material) that is present around the holes through which the fastener 134 and/or the threaded portion 128 pass.

Figure 2:
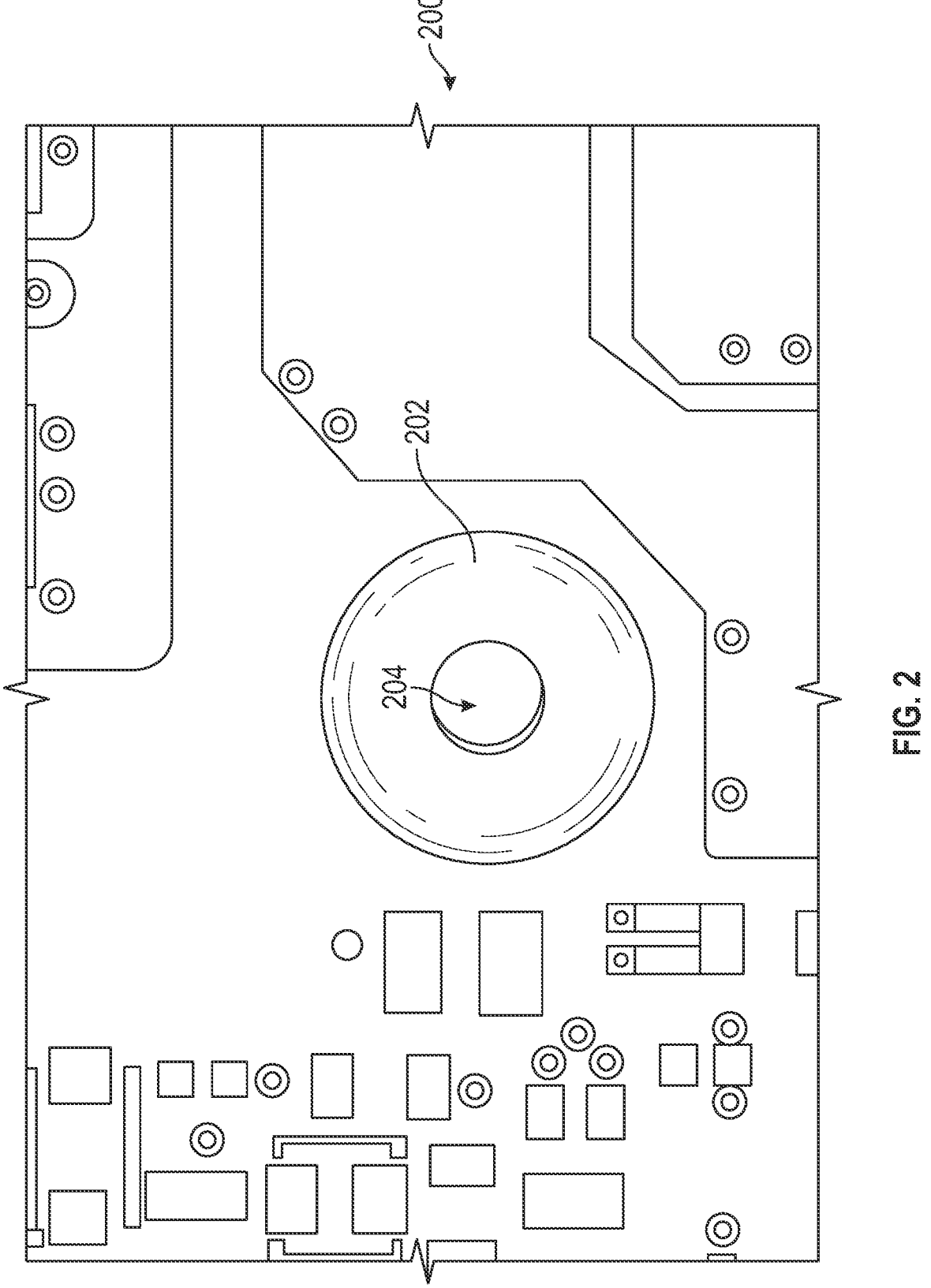
FIG. 2 is a schematic illustration of a portion of a circuit board that may be used with CCAs in accordance with the present disclosure.

For example, referring now to FIG. 2, a schematic illustration of a portion of a circuit board 200 that may be used in electronic units of the present disclosure is shown. The circuit board 200 may be one of multiple circuit boards that can be assembled into a CCA within an enclosure, such as shown and described herein. The circuit board 200 includes a mounting feature 202 having an aperture 204 formed thereby. The mounting feature 202 may include copper plating or may otherwise be coated or plated with a material for thermal and/or electronic conduction. The mounting feature 202 may be provided on both sides (top and bottom) of the circuit board 200, such that a washer may be arranged in contact on one side and a top of a support body of a standoff may be arranged in contact on the opposite side (e.g., as shown in FIG. 1B). Applying torque to a hex screw to disassemble a top circuit board can cause rotation to the standoff which will scratch the mounting feature 202 which is in the bearing area of the standoff that is below the circuit board relative to the hex screw (e.g., as shown in FIG. 1B). If some signal or power traces fall or fail near the aperture 204, this can cause a short circuit on the circuit board 200 and/or cause damage to the circuit board 200. Additionally, this scratching of the material of the mounting feature 202 may release copper filings or the like which may become foreign object debris. This foreign object debris is made from copper and thus can cause additional risk of short circuits on the circuit board 200 and/or to other electronics of the electronic unit in which the circuit board 200 is installed.

In view of the above, embodiments of the present disclosure are directed to unique standoff configurations that can reduce scratching, reduce friction production, reduce chance of rotation of the standoff when rotating a fastener, and improving the ease and efficiency of assembly and disassembly of electronic units having CCAs or the like. As such, in accordance with some embodiments of the present disclosure, a standoff, screw, and washer configuration is provided to address these items and provide other features and advantages as described herein. For example, in accordance with embodiments of the present disclosure, a unique standoff structure is provided that works in concert with an additional washer to reduce or eliminate the scratch risk associated with assembly and disassembly of CCAs as described above.

Figures 3A, 3B, 3C:
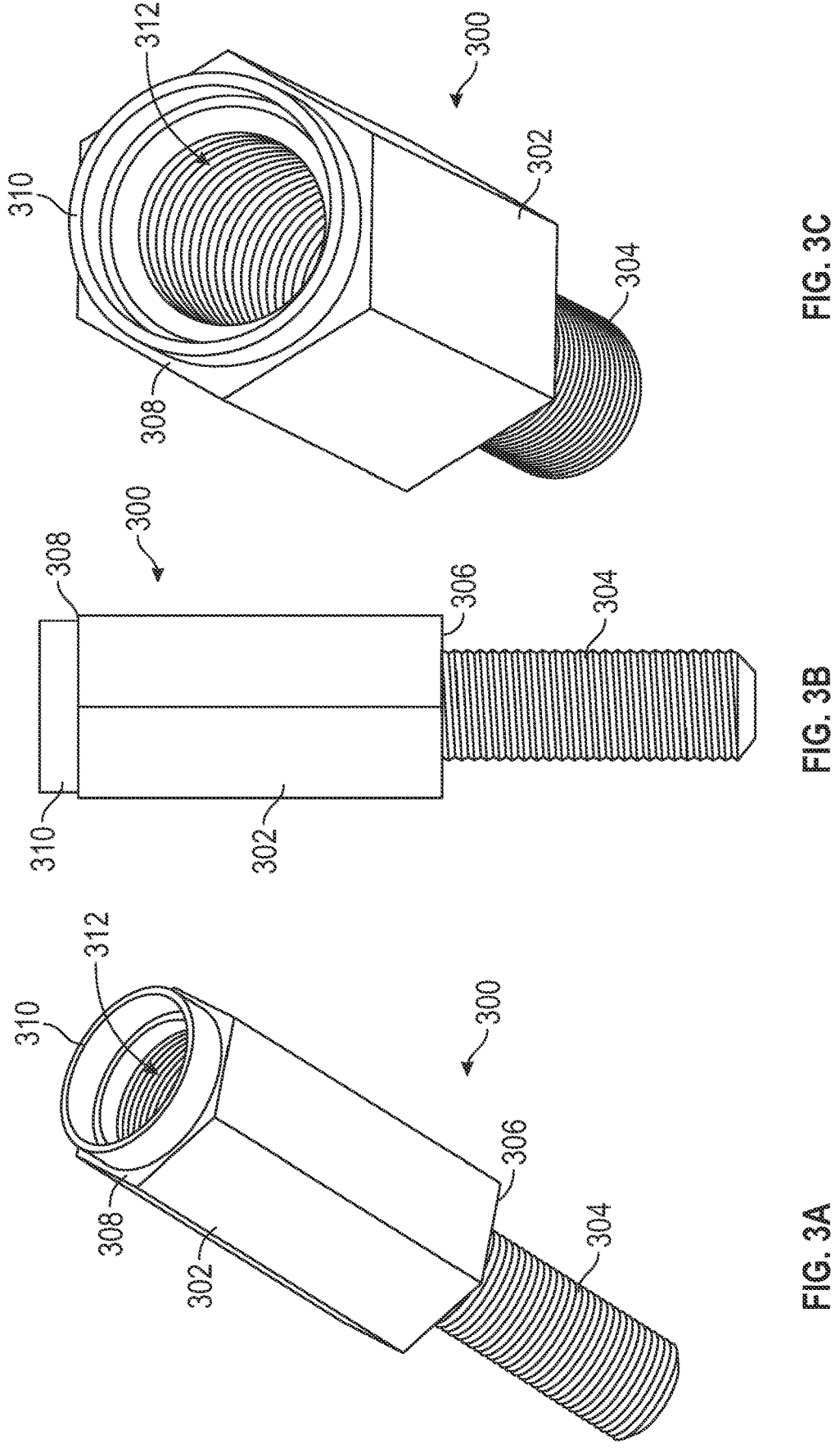
FIG. 3A is a perspective schematic illustration of a standoff for use with CCAs in accordance with an embodiment of the present disclosure.
FIG. 3B is a side elevation view of the standoff of FIG. 3A.
FIG. 3C is an alternative perspective view of the standoff of FIG. 3A.

Referring now to FIGS. 3A-3C, schematic illustrations of a standoff 300 for use with CCAs and for electronic units, such as control boxes and control units for aircraft application, are shown. The standoff 300 is illustrative of an example embodiment of a standoff in accordance with embodiments of the present disclosure. The standoff 300 may be arranged to secure a first circuit board to a base of an enclosure and provide support and mounting functionality to secure a second circuit board to the first circuit board.

The standoff 300 includes a support body 302 with a threaded portion 304 extending therefrom. A first support shelf 306 is defined at a base of the support body 302 or between the support body 302 and the threaded portion 304. The first support shelf 306 is configured to rest on or engage with a washer or surface of a first circuit board (e.g., first circuit board 106 shown in FIGS. 1A-1B). At the opposite end of the support body 302 from the first support shelf 306 is a second support shelf 308. The second support shelf 308 is configured to receive a second circuit board that may rest on the second support shelf 308. The support body 302 may be hex shaped to allow for a tool to rotate the standoff 300. For example, the threaded portion 304 may be inserted through an aperture or hole in a first circuit board and into a post or the like (e.g., post 120 shown in FIGS. 1A-1B). The threaded portion 304 may then threadedly engage with the post by rotation of the standoff 300, such as by use of a tool to engage with the hex shape of the support body 302. It will be appreciated that other shapes may be used other than hex (e.g., square, polygonal, or other shape that may be engaged by a tool and provide the shelf features described herein).

At the end of the standoff 300 opposite the threaded portion 304 relative to the support body 302 is a sleeve 310. The sleeve 310 may be substantially cylindrical in shape and provide an opening and access to an internal bore 312 of the standoff 300. The internal bore 312 may be threaded and configured to receive and threadedly engage with a fastener, similar to that described above. The sleeve 312 extends outward from the second support shelf 308 and defines, in part, the second support shelf 308 external to the sleeve 310 and an opening/aperture is provided within the sleeve 310 for permitting a fastener to pass into the internal bore 312 of the standoff 300. The sleeve 310 may be formed through an extrusion procession, machining, additive manufacturing, separately formed and attached to the support body 302, or may be formed by other means and mechanisms as will be appreciated by those of skill in the art.

Figure 4B:
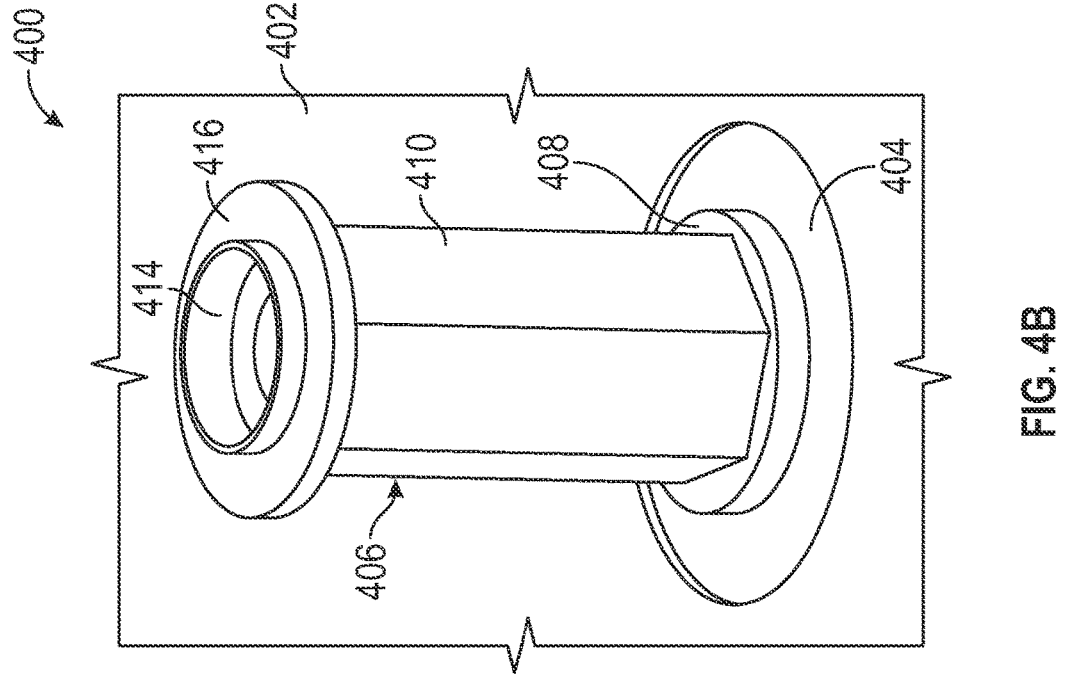
FIG. 4B is a partially assembled view of the CCA of FIG. 4A.
Figure 4A:
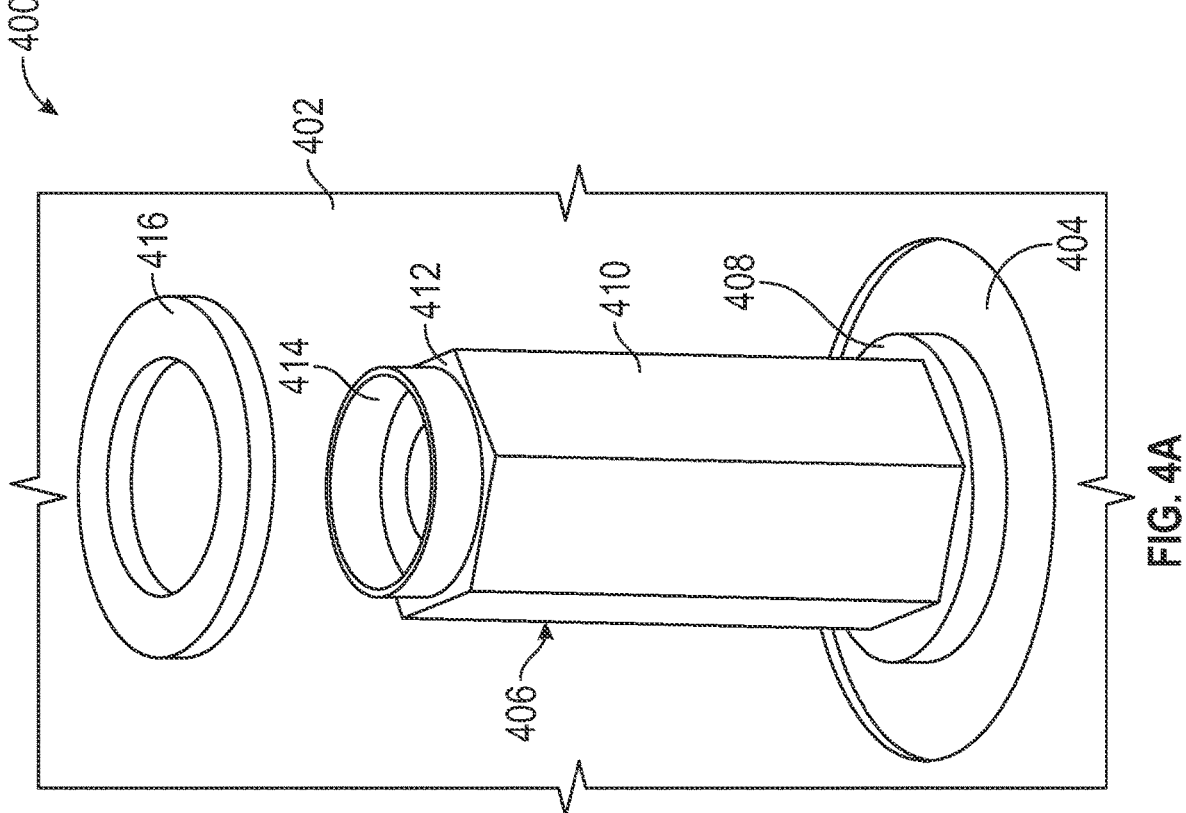
FIG. 4A is a schematic illustration showing a portion of an installation process of a CCA in accordance with an embodiment of the present disclosure.
Figure 5A:
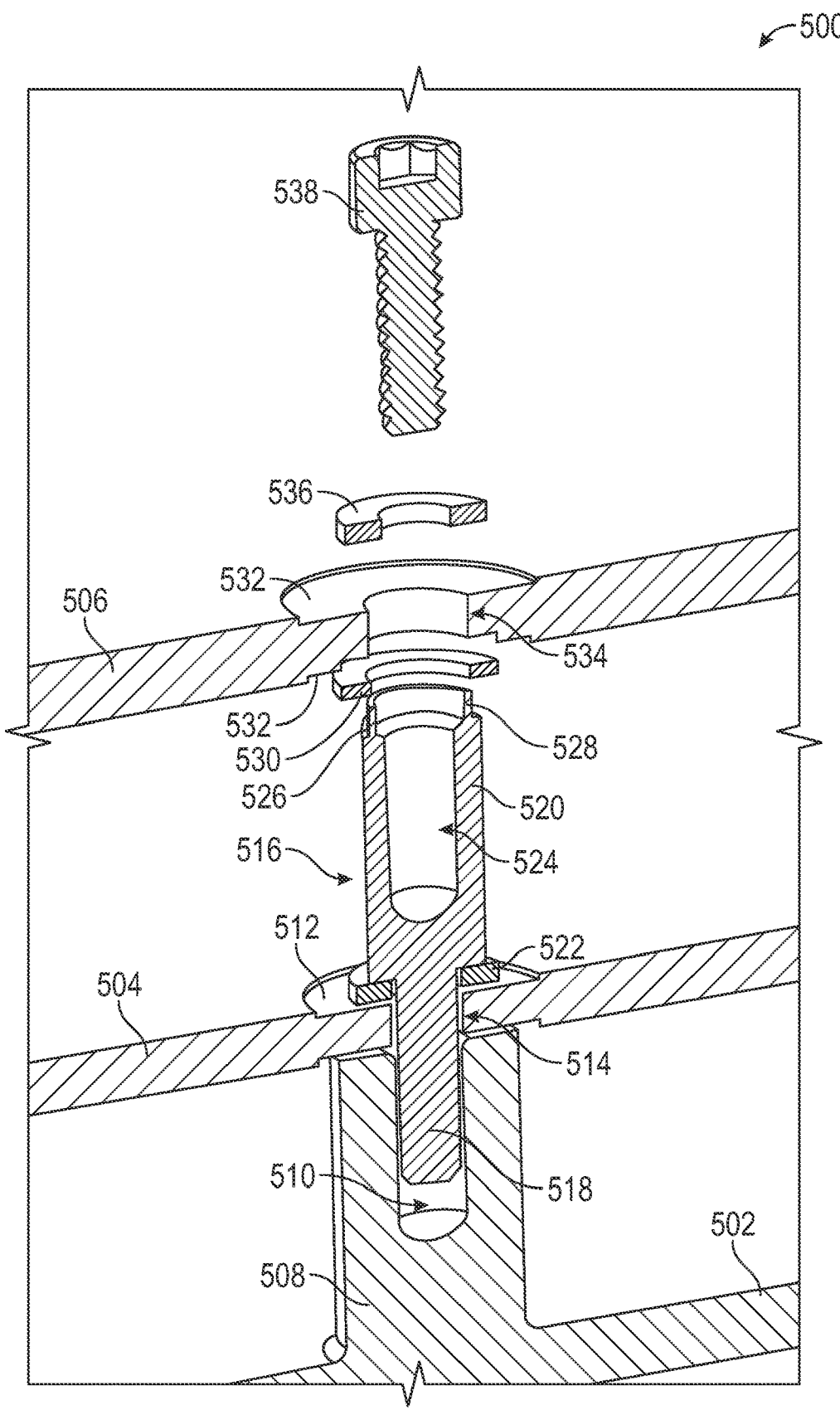
FIG. 5A is a partial cross-sectional schematic illustration of a part of an installation process of a CCA using a standoff in accordance with an embodiment of the present disclosure.
Figure 5C:
FIG. 5C is a perspective view of the CCA and standoff of FIG. 5A shown from a bottom-up perspective view thereof.
Figure 5C:
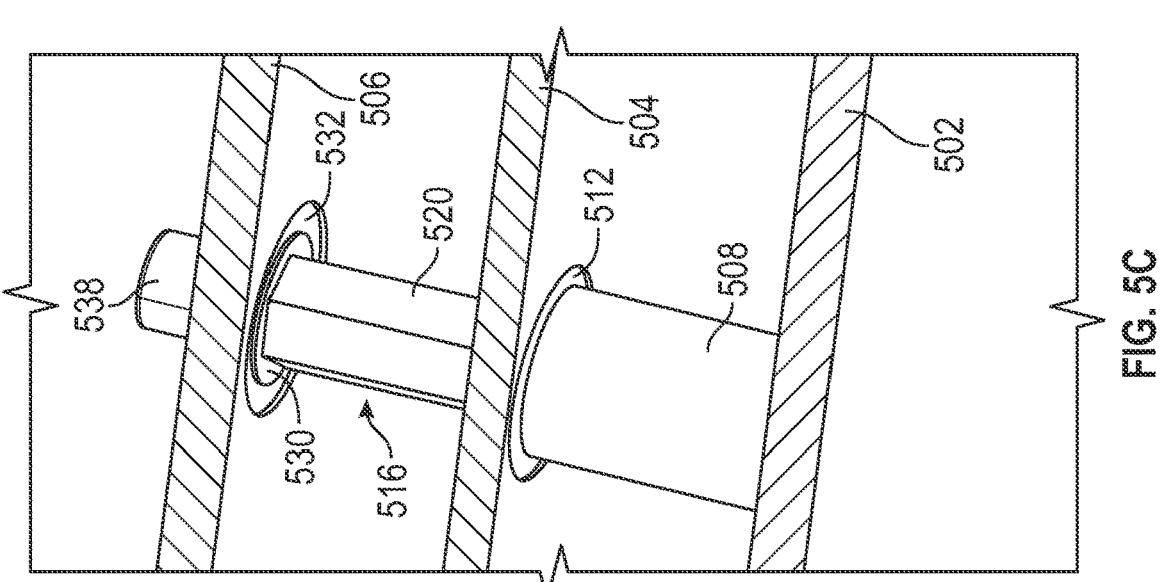
Figure 5B:
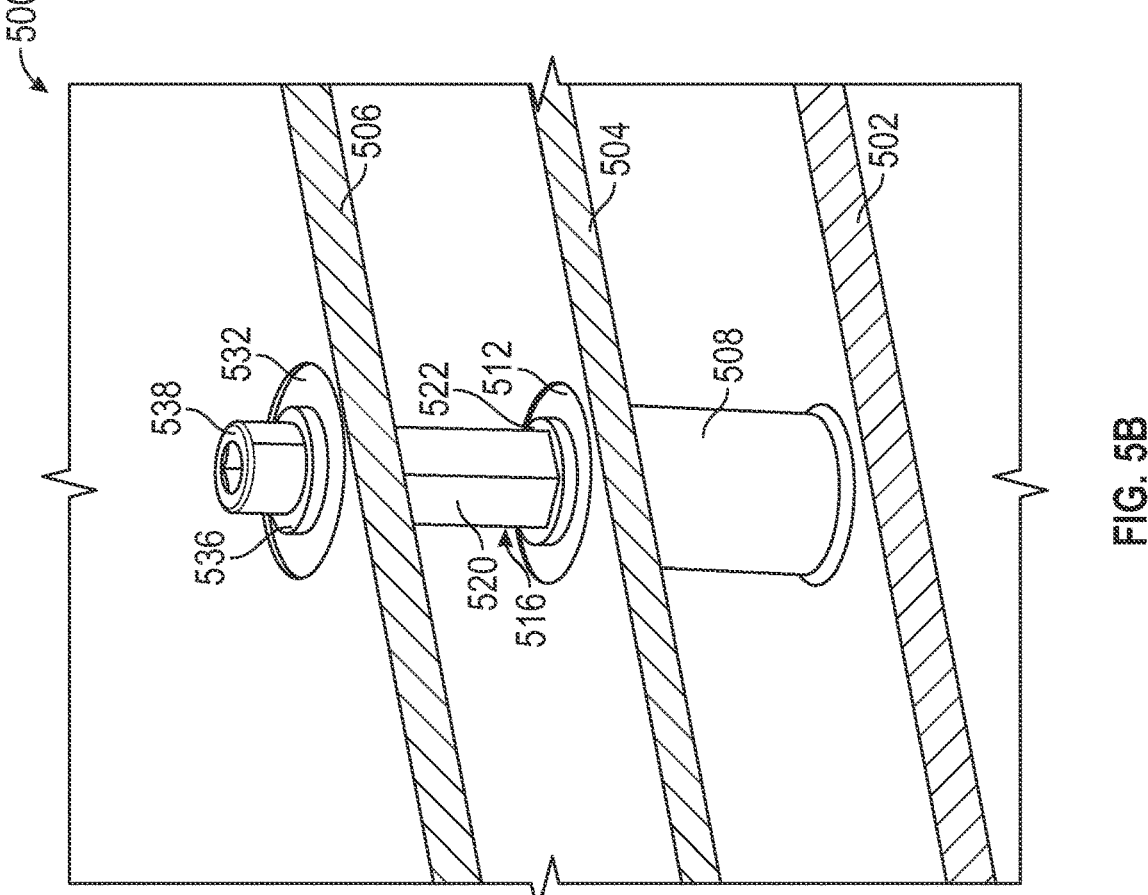
FIG. 5B is a perspective view of the CCA and standoff of FIG. 5A shown from a top-down perspective view thereof.
Figure 5D:
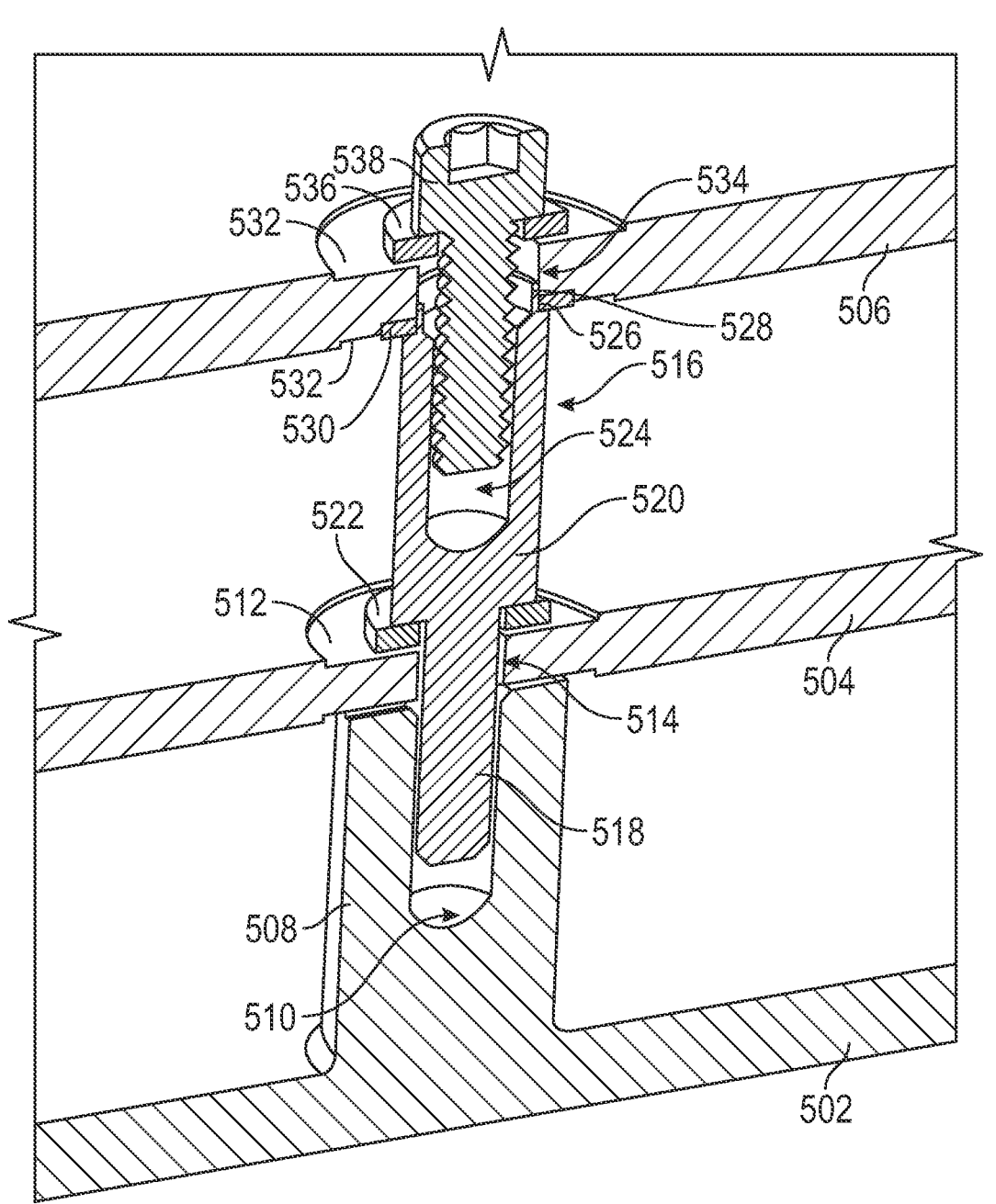
FIG. 5D is a partial cross-sectional illustration of the CCA and standoff of FIG. 5A shown in an assembled state.

Referring now to FIGS. 4A-4B, schematic illustrations of a part of a circuit board assembly 400 in accordance with an embodiment of the present disclosure are shown. The circuit board assembly 400 may be part of an electronic unit, similar to that shown and described above, including an enclosure with a base and cover, and multiple circuit boards.

In this illustrated view, a circuit board 402 is shown, which may be arranged as a first circuit board (e.g., first circuit board 106 shown in FIGS. 1A-1B). The electronic components and circuits of the circuit board 402 are not shown for simplicity. The circuit board 402 includes a mounting feature 404 that includes an aperture for permitting a threaded portion of a standoff 406 to pass therethrough (e.g., as shown in FIGS. 1A, 1B, 2).

In this illustration, the standoff 406 is installed to secure the circuit board 402 to a post of a base of an enclosure. As shown, a first washer 408 is arranged between a support body 410 of the standoff 406 and the mounting feature 404. A first support shelf (see, e.g., first support shelf 306 of FIGS. 3A-3B) may contact and rest upon the first washer 408. The first washer 408 may protect the mounting feature 404 from any potential friction due to rotation of the standoff 406 relative to the circuit board 402. At an opposite end of the support body 410 of the standoff 406, the standoff 406 includes a second support shelf 412 and a sleeve 414 extending outward from the second support shelf 412 in a direction away from the support body 410. A second washer 416 may be placed over the sleeve 414 and rest upon the second support shelf 412. The second washer 416 is retained in place by the sleeve 414 and the second support shelf 412. The second washer 416 may provide a surface upon which a second circuit board may be placed. As a result, the second circuit board will not directly contact the material of the standoff 406 (e.g., second support shelf 412) and thus friction therebetween may be avoided.

The sleeve 414 may have a height or length of extension from the second support shelf 412 that is less than a thickness of the second circuit board that is placed on the second washer 416. The height or length of extension from the second support shelf 412 of the sleeve 414 may be any height that extends from the surface of the second support shelf 412. In some embodiments, it may be preferred to have the height of the sleeve 414 be greater than a thickness of the second washer 416, although such requirement is not mandatory, and heights of the sleeve 414 may be less than the thickness of the second washer 416, but will still retain the second washer 416 in place on the second support shelf 412.

Referring now to FIGS. 5A-5D, schematic illustrations of a part of a circuit board assembly 500 in accordance with an embodiment of the present disclosure are shown. The circuit board assembly 500 may be part of an electronic unit, similar to that shown and described above, including an enclosure with a base and cover, and multiple circuit boards. In this embodiment, the circuit board assembly 500 includes a base 502, a first circuit board 504, and a second circuit board 506. The base 502 may be part of an enclosure and may have a cover or the like attached above the second circuit board 506. The electronic components and circuits of the first and second circuit boards 504, 506 are not shown for simplicity.

The base 502 includes a post 508 having a threaded internal bore 510. The first circuit board 504 has a mounting feature 512 having an aperture 514 defined therein. The mounting feature 512 may rest or sit on a top of the post 508 of the base 502 such that the aperture 514 of the first circuit board 504 aligns with the internal bore 510 of the post 508. The first circuit board 504 is affixed to the base 502 at the post 508 by a standoff 516.

The standoff 516 includes a threaded portion 518 that extends from a support body 520. The threaded portion 518 of the standoff 516 may pass through the aperture 514 of the first circuit board 504 and threadedly engage with the post 508 of the base 502. As shown, a first washer 522 may be positioned between the support body 520 of the standoff 516 and the mounting feature 512. The first washer 522 may be provided to avoid relative movement and contact between a surface of the support body 520 and the mounting feature 512 of the first circuit board 504 when the standoff 516 is rotated, such as for engagement or disengaged of the threaded portion 518 with the post 508. With the first circuit board 504 retained in place by, at least, the standoff 516 and the first washer 522, the second circuit board 506 may be installed.

The standoff 516 may be configured similar to the embodiment shown and described with respect to FIGS. 3A-3C, with an internal bore 524 defined within the support body 520. The internal bore 524 may be a threaded bore. As such, the standoff 516 is defined by the support body 520 having a threaded internal bore 524 and a threaded portion that extends from the support body 520, allowing for a two-step installation process for mounting multiple circuit boards within an enclosure. At an end of the standoff 516 opposite the threaded portion 518 is a support shelf 526 and a sleeve 528 extending outward from the support shelf 526. To install the second circuit board 506 to the standoff 516, a second washer 530 is installed over the sleeve 528 and arranged to rest on the support shelf 526 of the support body 520. The sleeve 528 may be provided to retain the second washer 530 in place on the end of the standoff 516. The second circuit board 506 includes a respective mounting feature 532 having an aperture 534 defined therein. The second circuit board 506 may thus rest upon the second washer 530 which in turn rests upon the support shelf 526 of the standoff 516. The second washer 530 may be provided to avoid relative movement and contact between a surface of the support body 520 (e.g., the support shelf 526) and the mounting feature 532 of the second circuit board 506.

With the second circuit board 506 installed over the sleeve 528 and resting on the second washer 530, the second circuit board 506 may be affixed to the standoff 516. For example, as shown, a third washer 536 may be positioned on the mounting feature 532 of the second circuit board 506. A fastener 538 may be passed through the third washer 536, the aperture 534 of the second circuit board 506, the sleeve 528 and the second washer 530, and threadedly engaged with the internal bore 524 of the standoff 516. As a result, the second circuit board 506 will be sandwiched between the second washer 530 and the third washer 536, and there will be no direct contact between the second circuit board 506 (e.g., the mounting feature 532) and the support shelf 526 of the standoff 516. Accordingly, if the fastener 528 is rotated and causes rotation of the standoff 516, there will be no direct material contact between the material of the standoff 516 and the first and/or second circuit boards 504, 506 due to the inclusion of the first, second, and third washers 522, 530, 536.

Figure 6:
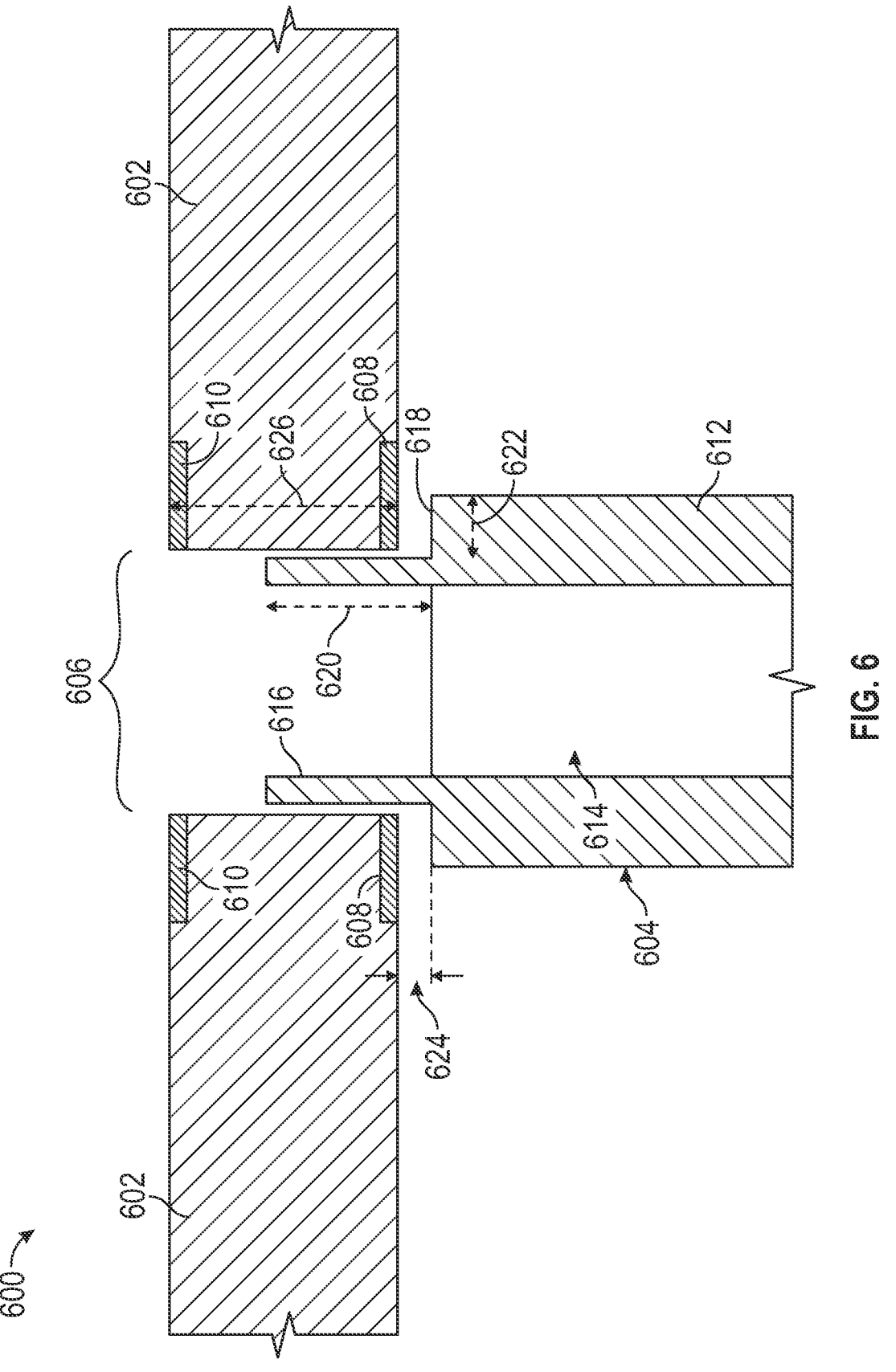
FIG. 6 is a schematic illustration of a portion of a CCA and standoff in accordance with an embodiment of the present disclosure.

Referring now to FIG. 6, an enlarged illustration of a portion of a circuit board assembly 600 in accordance with an embodiment of the present disclosure is shown. The illustration of FIG. 6 shows a cross-sectional detail of a top or upper circuit board 602 as arranged relative to a standoff 604. The circuit board 602 may be arranged as part of the circuit board assembly 600 and may be positioned above an additional circuit board (not shown) to which the standoff 604 is positioned to retain or secure against a post of a base or the like, as shown and described above. The circuit board 602 includes an aperture 606 that is defined, at least in part, by a first mounting feature 608 and a second mounting feature 610. Although shown as separate mounting features, the first and second mounting features 608, 610 may be parts of a single structure that extends from the first mounting feature 608 along the sidewalls defining the aperture 606 to the second mounting feature 610.

The standoff 604 has a support body 612 that defines an internal bore 614, which may be a threaded bore arranged to receive a threaded fastener (e.g., bolt or screw), such as shown and described above. Although not shown, the standoff 604 may include a threaded portion that is configured to secure another circuit board to a base of an enclosure. Extending from the support body 612 is a sleeve 616 with a support shelf 618 defined external to the sleeve 616. The sleeve 616 extends for a distance 620 from the support shelf 618 and the support shelf 618 has a width 622 that is defined from the sleeve 616 to an edge of the support body 612. The support shelf 618 may have a variable dimension, which may be caused, in part, by the support body 612 having a hex shape, such that the support shelf 618 will have portions of smaller area and portions of greater area, due to the material limitations of a hex shaped support body 612 (e.g., as shown in FIG. 3C).

Although not shown for clarity, a washer may be arranged within a washer gap 624 that is between the standoff shelf 618 of the standoff 604 and a surface of the first mounting feature 608. With a washer installed in the washer gap 624 and about the sleeve 616, direct material contact between the first mounting feature 608 and the standoff shelf 618 may be prevented. The washer gap 624 may be equal to a thickness of a washer that is installed on the standoff 604 between the support shelf 618 and the circuit board 602. As such, a thickness of a washer (e.g., second washer 530 shown in FIGS. 5A-5D) may be equal to the washer gap 624. In some non-limiting embodiments, the distance 620 of the sleeve 616 may be defined relative to the thickness of the washer (or the washer gap 624 shown in FIG. 6). For example, in some embodiments, the distance 620 of the sleeve 616 may be 2.5 times the washer gap 624 (or 2.5 times the thickness of the washer installed therein), up to a maximum of the top surface of the circuit board 602.

In some embodiments, the distance 620 (e.g., height or length) of the sleeve 616 may be selected to ensure at least a minimum of overlap between the sleeve 616 and a thickness 626 of the circuit board 602 is provided. In some embodiments, the distance 620 of the sleeve may be 10% to 100% of the thickness 626 of the circuit board 602. In some embodiments, the distance 620 may be equal to a thickness of the washer that will be placed over the sleeve 616 and that rests upon the support shelf 618. In other embodiments, the distance 620 may be less than the thickness of the washer, but greater than a zero thickness, such that the sleeve 616 will retain the washer on the top of the standoff 604 and prevent relative translational movement of the washer relative to the standoff 604 (e.g., prevent washer from falling off the top of the standoff 604). In still other embodiments, the distance 620 may be greater than a thickness of the washer and extend through the aperture 606 toward the second mounting feature 610. The maximum length of the distance 620 may be equal to the thickness 626 of the circuit board 602 plus a thickness of the washer, such that the sleeve 616 does not extend above a top surface of the circuit board 602. It may not be desirable to have the sleeve 616 extend above the top surface of the circuit board 602 because a fastener is to be inserted into the aperture 606 and threadedly engage with the internal bore 614 of the standoff 604. However, it will be appreciated that the distance 620 may extend above the top of the circuit board 602 for a distance equal to or less than a washer thickness that is placed on and in contact with the second mounting feature 610.

Advantageously, embodiments described herein provide for improved assembly components for stacked circuit card assemblies. In accordance with some embodiments, standoffs are provided for securing multiple circuit boards within an enclosure while reducing or eliminating the risk of damage to a part of the circuit boards/cards during assembly and disassembly. For example, in accordance with some embodiments, standoffs as described herein provide a support structure to hold a washer on a support shelf of a standoff and thus allow for use of a washer between surfaces of the standoff and surfaces of the circuit boards. The washer may be retained on the standoff by a sleeve and supported on a support shelf defined external to the sleeve on an end of a support body of the standoff. Accordingly, some embodiments of the present disclosure provide for an arrangement of a fastener, set of washers, and standoff that prevent direct material contact between the circuit boards (or mounting features thereof) and the standoff. As such, scratching and wear of material of either the circuit board and/or the standoff may be avoided or prevented.

The use of the terms "a", "an", "the", and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other. As used herein, the terms "about" and "substantially" are intended to include the degree of error associated with measurement of the particular quantity based upon the equipment available at the time of filing the application. For example, the terms may include a range of ±8% of a given value or other percentage change as will be appreciated by those of skill in the art for the particular measurement and/or dimensions referred to herein.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

Accordingly, the present disclosure is not to be seen as limited by the foregoing description, but is only limited by the scope of the appended claims.

What is claimed is:

1. A circuit card assembly comprising:
an enclosure;
a first circuit board installed within the enclosure;
a second circuit board installed within the enclosure;
a standoff arranged to mount the first circuit board and the second circuit board within the enclosure, the standoff comprising:
a support body extending between the first circuit board and the second circuit board, the support body having a first end and a second end, wherein the first end is proximate the first circuit board and the second end is proximate the second circuit board;

a threaded portion extending from the first end and passing through an aperture of the first circuit board;
an internal bore defined within the support body and having an opening at the second end of the support body;
a sleeve extending from the second end of the support body, the sleeve having an opening aligned with the opening of the internal bore, wherein the sleeve extends into an aperture of the second circuit board; and
a support shelf defined at the second end of the support body, the support shelf defined at an external surface of the sleeve;
a first washer arranged between the first end of the support body and a surface of the first circuit board; and
a second washer arranged between the support shelf and a surface of the second circuit board, wherein the second circuit board is installed on top of the second washer.

2. The circuit card assembly of claim 1, further comprising:
a third washer arranged on a surface of the second circuit board opposite the second washer; and
a fastener installed to pass through the third washer, the aperture of the second circuit board, the second washer, and engage with the support body within the internal bore.

3. The circuit card assembly of claim 1, wherein the enclosure comprises a base and a cover.

4. The circuit card assembly of claim 1, wherein the enclosure comprises a post, wherein the threaded portion of the standoff is installed through the first washer and into threaded engagement with the post.

5. The circuit card assembly of claim 1, wherein the sleeve extends a distance from the support shelf that is less than a thickness of the second circuit board.

6. The circuit card assembly of claim 1, wherein the first circuit board comprises a first mounting feature and the second circuit board comprises a second mounting feature.

7. The circuit card assembly of claim 1, wherein:
a third washer is arranged on the second circuit board on a side opposite the second washer; and
a fastener is installed through the third washer, the second circuit board, the second washer, and into engagement with the support body of the standoff.

8. The circuit card assembly of claim 1, wherein the sleeve has a distance of extension from the support shelf that is at least 10% a thickness of the second circuit board.

9. The circuit card assembly of claim 2, wherein the internal bore is threaded.

10. The circuit card assembly of claim 6, wherein each of the first mounting feature and the second mounting feature define respective apertures.

11. The circuit card assembly of claim 6, wherein each of the first mounting feature and the second mounting feature are defined by a conductive material.

12. The circuit card assembly of claim 7, wherein the first circuit board comprises a mounting feature having an aperture, wherein the first washer is arranged in contact with the mounting feature and aligned with the aperture of the first circuit board.

13. The circuit card assembly of claim 7, wherein the second circuit board comprises a mounting feature having an aperture, wherein the second washer is arranged in contact with the mounting feature on a first side of the second circuit board and the third washer is arranged in contact with the mounting feature on a second side of the second circuit board, wherein the second washer and the third washer are aligned with the aperture of the second circuit board.

14. A standoff assembly for use with circuit card assemblies (CCA), the standoff assembly comprising:

a support body having a first end and a second end;

a threaded portion extending from the first end;

an internal bore defined within the support body and having an opening at the second end of the support body;

a sleeve extending from the second end of the support body, the sleeve having an opening aligned with the opening of the internal bore;

a support shelf defined at the first end of the support body, the support shelf defined at an external surface of the sleeve;

a first washer arranged to fit over the threaded portion and contact the first end of the support body;

a second washer arranged to fit over the sleeve and contact the second end of the support body; and further comprising a third washer configured to be positioned above the second washer and the sleeve when installed within a CCA.

15. The standoff assembly of claim 14, wherein the internal bore is threaded.

16. The standoff assembly of claim 14, wherein the sleeve has a length that is at least 2.5× a thickness of the second washer.

17. The standoff assembly of claim 14, wherein the support body is formed from a conductive material.

\* \* \* \* \*